(12) United States Patent
Lenoble et al.

(10) Patent No.: US 6,806,156 B2
(45) Date of Patent: Oct. 19, 2004

(54) PROCESS FOR FABRICATING A MOS TRANSISTOR OF SHORT GATE LENGTH AND INTEGRATED CIRCUIT COMPRISING SUCH A TRANSISTOR

(75) Inventors: Damien Lenoble, Gieres (FR); Isabelle Guilmeau, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/454,361

(22) Filed: Jun. 4, 2003

(65) Prior Publication Data

US 2004/0046192 A1 Mar. 11, 2004

(30) Foreign Application Priority Data

Jun. 4, 2002  (FR) .............................. 02 06870

(51) Int. Cl.[7] .................. H01L 21/336; H01L 21/3205; H01L 21/4763
(52) U.S. Cl. ........................ 438/303; 438/301; 438/585
(58) Field of Search ............................... 438/138, 135, 438/303, 585, 253, 200, 734, 301

(56) References Cited

U.S. PATENT DOCUMENTS

| 5,492,847 A | 2/1996 | Kao et al. | |
|---|---|---|---|
| 5,736,446 A | 4/1998 | Wu | |
| 5,976,769 A | * 11/1999 | Chapman | 438/734 |
| 6,180,472 B1 | * 1/2001 | Akamatsu et al. | 438/303 |
| 6,274,426 B1 | * 8/2001 | Lee et al. | 438/253 |
| 6,274,445 B1 | 8/2001 | Nouri | |
| 6,277,683 B1 | * 8/2001 | Pradeep et al. | 438/200 |
| 6,448,165 B1 | * 9/2002 | Yu et al. | 438/585 |
| 6,537,860 B2 | * 3/2003 | Akiyama et al. | 438/135 |
| 6,642,590 B1 | * 11/2003 | Besser et al. | 257/410 |
| 6,664,143 B2 | * 12/2003 | Zhang | 438/138 |
| 6,727,534 B1 | * 4/2004 | Buller et al. | 257/288 |

FOREIGN PATENT DOCUMENTS

GB    2 362 029 A    11/2001

* cited by examiner

*Primary Examiner*—John F. Niebling
*Assistant Examiner*—Walter L. Lindsay, Jr.
(74) *Attorney, Agent, or Firm*—Lisa K. Jorgenson; Jose Gutman; Fleit, Kain, Gibbons, Gutman, Bongini & Bianco P.L.

(57) ABSTRACT

Process for fabricating a transistor comprises producing source and drain extension regions, consisting in forming a gate region on a semiconductor substrate and in implanting dopants into the semiconductor substrate on either side of and at a certain distance from the gate of the transistor. The producing of the source and drain extension regions consists in forming an intermediate layer (CI) on the sidewalls of the gate (GR) and on the surface of the semiconductor substrate. This intermediate layer is formed from a material that is less dense than silicon dioxide. The implantation of dopants (IMP) is carried out through that part of the intermediate layer that is located on the semiconductor substrate.

16 Claims, 2 Drawing Sheets

PROCESS FOR FABRICATING A MOS TRANSISTOR OF SHORT GATE LENGTH AND INTEGRATED CIRCUIT COMPRISING SUCH A TRANSISTOR

CROSS-REFERENCE TO RELATED APPLICATION

This application is based upon and claims priority from prior French Patent Application No. 02 06870, filed on Jun. 4, 2002, the entire disclosure of which is herein incorporated by reference.

BACKGROUND OF THE INVENTION

1. Field of the Invention

The invention relates to integrated circuits, and especially but not exclusively to isolated-gate field-effect transistors (MOSFET transistors) of short gate length, for example less than 180 nanometers, and in particular those of nanoscale length, that is to say the gate length of which is less than about 100 nm.

2. Description of the Related Art

The fabrication of small-scale, particularly nanoscale, MOS transistors, of conventional architecture, is nowadays confronted with intrinsic problems that limit their operating characteristics.

Among such problems, the effects called "short channel" effects (reduction in the threshold voltage of the transistor when the gate length decreases and consequently the channel length decreases) become predominant, thus therefore having a negative impact on the current characteristics of the transistors.

It is recognized that these "short channel" effects are due to a reduction in the effective length of the conduction channel because of lateral diffusion (that is to say beneath the gate electrode) of the source and drain extension zones (usually called the "LDD zones" by those skilled in the art).

One of the effective means of reducing these parasitic "short channel" effects is to reduce the depth of the junctions of these extension zones, thereby reducing the lateral diffusion (which is proportional to the vertical depth of the junction) of these extension zones.

However, the reduction in depth of the junctions of these zones is accompanied by an increase in the layer resistance of these junctions when the depths become less than 40 nm in the case of the usual fabrication processes which provide an ion implantation of doping species (typically boron and arsenic) and then a heat activation by annealing at high temperature.

It should also be noted that depths of less than 30 nm are recommended in the case of CMOS technologies below 100 nm.

Furthermore, increasing the layer resistance of the junction increases the value of the parasitic resistance of the device, thus limiting the saturation current performance of the transistors.

Thus, technologists at the present time are confronted with the compromise between control of the short channel effects (that is to say control of the threshold voltage in order to keep the leakage current of the transistor below desired values) and the increase in the performance of the transistors (saturation current in the on state), this performance being partly governed by the value of the parasitic series resistance (and therefore the junction resistance).

One solution proposed consists in placing isolating lateral regions (spacers) on the sidewalls of the gate of the transistor, these being called offset spacers, allowing the lateral position of the LDD junctions to be offset during implantation of the latter. The use of deep (greater than 40 nm) junctions that are weakly resistive is then possible.

Such a solution makes it possible to control the effective conduction length of the channel via the width of the offset spacers, thus guaranteeing good control of the short channel effects while integrating low-resistivity junctions for enhanced current performance. However, integration of such a solution is confronted with technological production difficulties and the addition of expensive fabrication steps.

In particular, mention may be made, as technological difficulties, of the deposition of a conformal coating of a silicon-based material, the anisotropic and selective etching of this coating so as to stop on the active zone, whatever the surface density of the transistors, and the production of standard spacers that have to be readjusted.

This is because the offset spacers are usually made of silicon-based materials and it is consequently necessary to carry out anisotropic etching of the conformal coatings so as to reduce the thickness of the coatings at the base of the spacers, since, without this thickness reduction, the energy increase needed to pass through this stack in order to reach the active zone of the transistor (that is to say for producing the LDD zones) is such that the increase in the lateral dispersion of the dopants compensates for the offset provided by the offset spacers.

Furthermore, in some cases the lateral dispersion beneath the gate electrode is even degraded.

Accordingly, there exists a need for overcoming the disadvantages of the prior art as discussed above.

SUMMARY OF THE INVENTION

Embodiments of the present invention aim to provide a solution to these problems.

In accordance with a broad aspect of the present invention a process produces a lateral offset of the junctions of the LDD zones in a very simple manner, without significantly modifying a standard fabrication process.

An embodiment of the present invention therefore provides a process for fabricating a MOS transistor, comprising a step of producing source and drain extension regions (LDD regions), consisting in forming a gate region on a semiconductor substrate and in implanting dopants into the substrate on either side of and at a certain distance from the gate of the transistor.

According to a general feature of the invention, the step of producing the source and drain extension regions consists in forming an intermediate layer on the sidewalls of the gate and on the surface of the substrate, this intermediate layer being formed from a material that is less dense than silicon dioxide. The implantation of dopants is then carried out through that part of the intermediate layer that is located on the surface of the substrate.

Thus, that part of the intermediate layer that is located on the vertical sidewalls of the gate allows the implantation to be offset laterally. Moreover, because of the low density of the material of the intermediate layer, the increase in implantation energy needed to pass through this layer remains low. Thus, compared with the conventional case, there remains a significant gain in terms of the lateral dispersion of the LDD junctions beneath the gate.

The invention therefore makes it possible for deep junctions to be easily integrated (without additional etching compared with the conventional process) while preserving the electrical length of the conduction channel.

The material forming the intermediate layer may advantageously be an anti-reflective material used as anti-reflective sublayer during exposure of a photoresist. Such a material is, for example, known by those skilled in the art by the name "BARC" (bottom anti-reflective coating) material available, for example, from Shipley. This material is an inorganic material used in photolithography to avoid parasitic reflections from the substrate during exposure of the resist.

The invention is therefore noteworthy in that it uses a material whose purpose and function were hitherto completely different from those intended here. Thus, whereas in the conventional photolithography process the anti-reflective coating is conventionally etched after the resist features have been developed, this layer of BARC-type material, deposited conformally and having a thickness varying between 1 and 100 nm, is, according to the invention, intentionally preserved after development of the resist features.

As a variant, it would also be possible to use, as intermediate layer material, porous silicon dioxide.

According to one method of implementing the invention, the material forming the intermediate layer (Cl) may be etched selectively with respect to silicon and the intermediate layer can be removed after the implantation of dopants. This is especially the case when the layer used is of the BARC type.

This being the case, as a variant, in particular when the material used for the intermediate layer is porous silicon, it is possible to leave a portion of the intermediate layer on the sidewalls of the gate and on part of the substrate after the implantation. Isolating lateral regions (spacers) resting on the sidewalls of the gate and on part of the substrate are therefore produced, these isolating lateral regions comprising the residual portion of the intermediate layer surmounted by another material, for example silicon nitride. The spacers finally produced are therefore bilayers.

Advantageously, the implantation energy is chosen so as to obtain a maximum dopant distribution at a depth of at least 3 to 4 nm.

The fact of being allowed to use, within the context of this invention, higher implantation energies makes it possible to limit the impact of the parasitic re-oxidation associated with the operation of etching the intermediate layer formed from BARC material, since the distribution of the dopants is located further away from the re-oxidized surface. The consumption of dopants in the oxide therefore remains marginal.

It should be noted that it is also possible to make the dopants diffuse, via a thermal activation annealing step, before the intermediate layer is removed, so as to prevent any parasitic surface effect due to the etching or to any subsequent cleaning operation.

The subject of the invention is also an integrated circuit comprising at least one transistor obtained by the process as defined above.

According to one embodiment, the transistor includes isolating lateral regions resting on the sidewalls of the gate and on part of the substrate, these isolating lateral regions comprising an intermediate layer formed from a material that is less dense than silicon oxide, for example porous silicon dioxide, this intermediate layer being surmounted by another material.

BRIEF DESCRIPTION OF THE DRAWING

Other advantages and features of the invention will become apparent on examining the detailed description of methods of implementation and of embodiments, which are entirely non-limiting, and the appended drawings in which.

DESCRIPTION OF THE PREFERRED EMBODIMENTS

Figure 1:
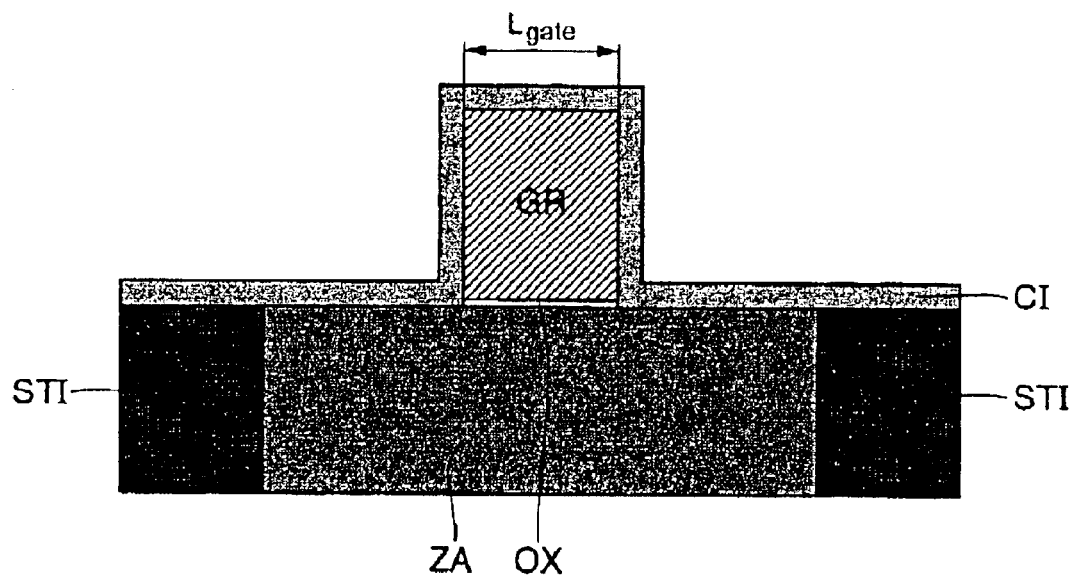
FIGS. 1 to 3 illustrate a first method of implementing a process according to the invention, resulting in a first embodiment of a transistor according to the invention.
Figure 2:
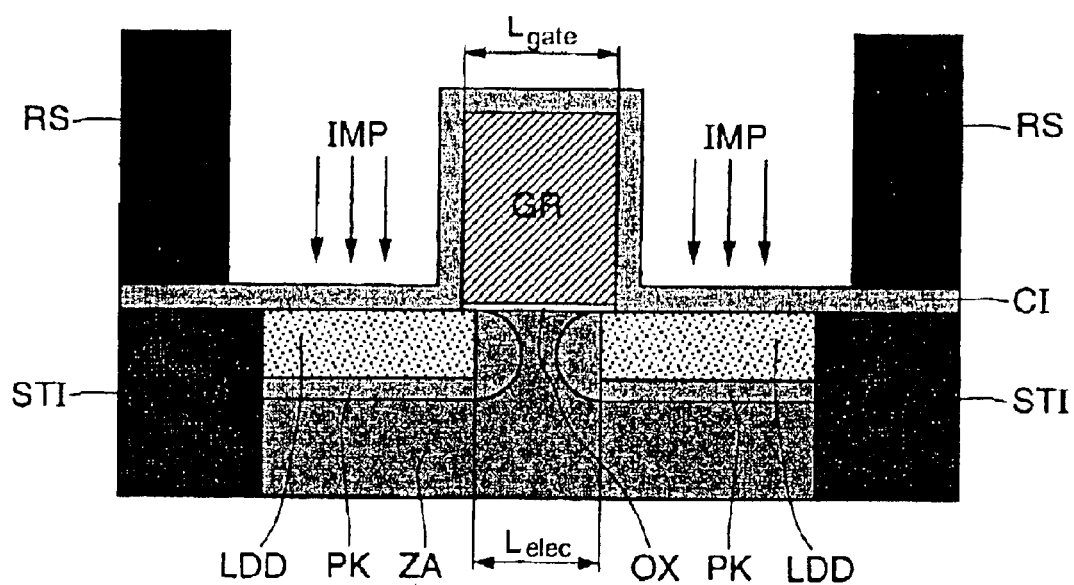
Figure 3:
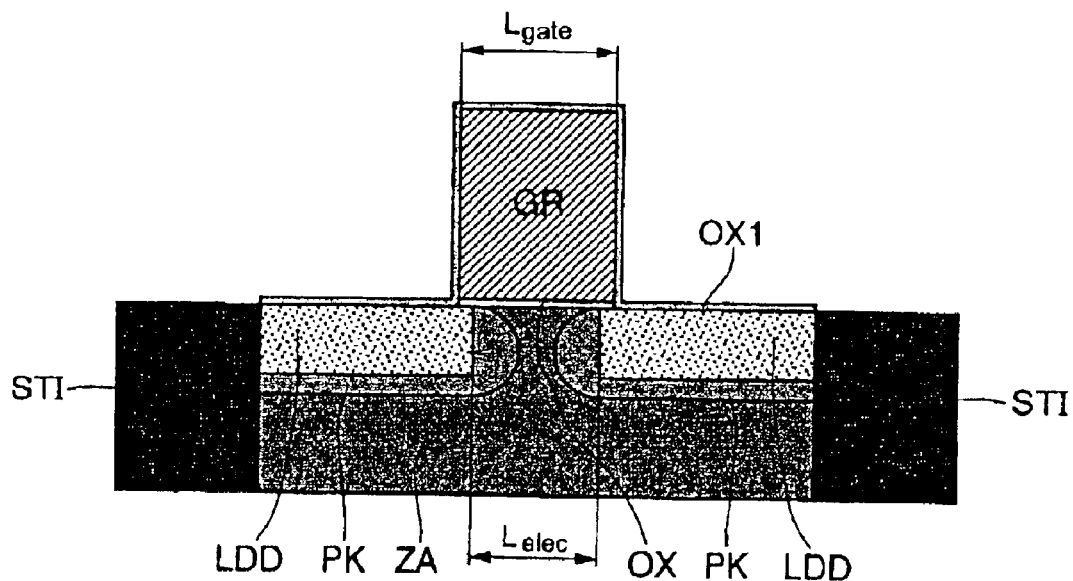

In FIGS. 1 to 3, the reference ZA denotes an active zone of a silicon semiconductor substrate, bounded laterally by lateral isolation zones STI, for example of the shallow trench type.

These lateral isolation regions STI are produced in a conventional manner known per se to those skilled in the art.

After having also produced, in a conventional manner known per se, the gate GR of the transistor, which is isolated from the active zone by a gate oxide OX, an intermediate layer Cl, formed here from a BARC-type material, is deposited with a thickness typically between 1 and 100 nm.

This layer Cl is deposited conformally. This BARC-type inorganic material has a very low density, typically 1 g/cm$^3$.

Next, a resist layer RS is deposited (FIG. 2) in a conventional manner known per se, this resist layer being developed and etched locally so as to expose the intermediate layer Cl.

The implantation of dopants IMP is then carried out via the aperture defined by the resist block. This implantation IMP is thus carried out especially through the horizontal portion of the layer Cl so as to form the regions LDD.

The lateral offset provided by the vertical part of the layer Cl is in this case greater than the increase in the lateral dispersion associated with the increase in the implantation energy needed to pass through the depth of the layer Cl. An electrical length $L_{elec}$ is therefore obtained which is certainly less than the gate length $L_{gate}$ but greater than that which would have been obtained in the conventional process of the prior art.

As regards the implantation energy, which has to be slightly higher than that used in the process of the prior art, because of having to pass through the layer Cl, a person skilled in the art will know to choose this so as to obtain a maximum dopant distribution at a depth of at least 3 to 4 nm, for example 10 nm.

By way of indication, for a maximum distribution at 10 nm, implantation through 20 nm of layer Cl formed from a BARC-type material results in a post-implantation lateral dispersion beneath the gate reduced by about 10 nm compared with an implantation through an equivalent thickness of silicon dioxide (density 2.3 g/cm$^3$) and reduced by about 7 nm compared with a direct conventional implantation into silicon, that is to say without offset spacers.

Regions or pockets PK are also formed, although this is not absolutely necessary, by oblique implantation of dopants of the opposite type to that used for the source, drain and LDD implantations. The implantation of these pockets PK may be carried out before or after implantation of the zones LDD. These pockets PK contribute to improving the control of the short channel effects and in particular prevent too large a drop in the threshold voltage of the transistor.

Contrary to the use of offset spacers according to the prior art, it is possible within the context of the present invention to carry out the implantation of the pockets PK with the same photolithographic masking level as that for the zones LDD, while maintaining their effectiveness. This is because it is known that the effectiveness of these pockets is connected with the fact that they are localized precisely within the active zone beneath the gate. This localization is less dispersed the lower their implantation energy. In the case of offset spacers according to the prior art, the implantation energy for the pockets PK must be increased significantly. In addition, according to the prior art, it is then usual to make a first masking level (before the offset spacers) in order to implant these pockets PK in a self-aligned manner on the gate, to remove the resist, to form the offset spacers and to remake a new masking level for the zones LDD.

Within the context of the present invention, it is possible to obviate this expensive limitation since the density of the materials used is low, and consequently the increase in energy to implant the pockets PK through the intermediate layer is quite acceptable.

The next step (FIG. 3) consists in removing the layer Cl and the resist RS by etching with an oxygen-containing plasma.

The type of etching allowing the layer Cl to be removed is oxidizing and results in the formation of a surface oxide OX1.

The fact of being allowed to use, within the context of this invention, a higher implantation energy allows the impact of the parasitic re-oxidation OX1 associated with the etching of the BARC material to be limited, since the distribution of dopants is located further away from the re-oxidized surface. The consumption of dopants in the oxide then remains marginal.

Moreover, according to a variant of the invention, the implantation of the pockets PK may be carried out after the layer Cl has been removed but before the resist has been removed. Such a variant allows the pockets PK to be implanted in a self-aligned manner on the gate, while offsetting the implantation of the zones LDD in order to control the short channel effects, and to do so with the same photolithographic level.

The rest of the transistor fabrication process is conventional and known per se and includes, in particular, the removal of the layer OX1 and then the formation of isolating spacers, for example made of silicon nitride, on the sidewalls of the gate.

The invention is not limited to the embodiments and the methods of implementation that have just been described, rather it encompasses all variants thereof.

Thus, the BARC-type material may be replaced with any material having a low density (less than silicon dioxide) and capable of being etched selectively with respect to silicon.

As an example, mention may be made of porous silicon dioxide. Such a material also has the advantage of not significantly modifying the conventional process for fabricating a MOS transistor.

Figure 4:
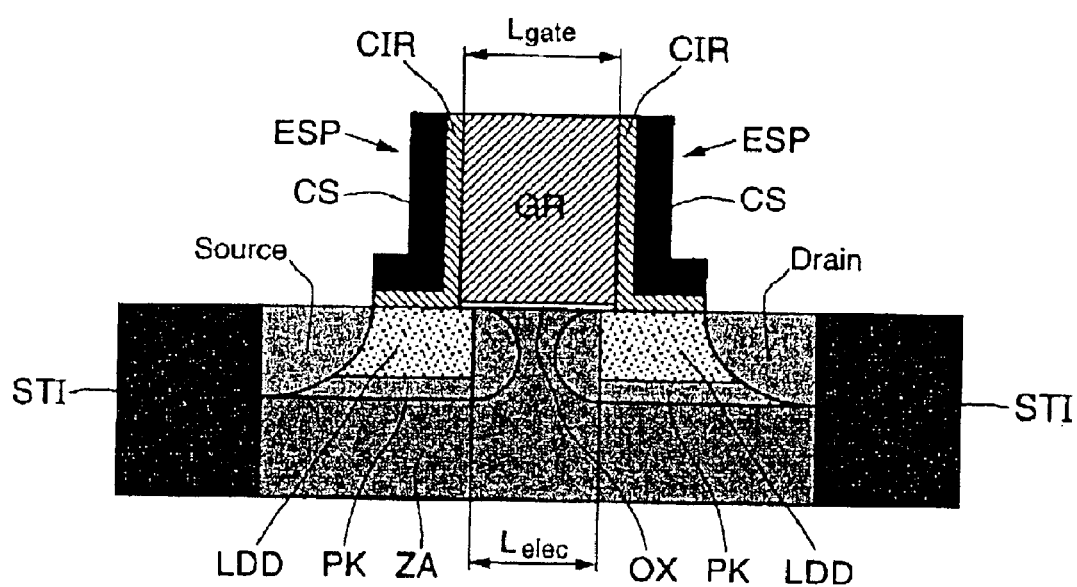
FIG. 4 illustrates an alternative embodiment of the invention.

This is because, as illustrated in FIG. 4, it is possible, after the implantation of the zones LDD, to remove only part of the intermediate layer Cl and leave a residual portion CIR of intermediate layer on the sidewalls of the gate and on the surface of the substrate. An upper layer CS, for example made of silicon nitride, is then formed in a conventional manner known per se on this layer CIR, so as to form bilayer spacers ESP.

The present invention is not limited to the examples described above. Many alternative embodiments are possible without departing from the scope defined by the appended claims. For example, it should be obvious to those of ordinary skill in the art that alternative embodiments of the new and novel transistor circuit element may be implemented in an integrated circuit comprising a circuit supporting substrate that supports at least a portion of the new and novel transistor circuit element discussed above. Additionally, the new and novel integrated circuit may be implemented in a computer system comprising at least one integrated circuit thereby providing the advantages of the present invention to such computer system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating a MOS transistor, comprising: producing source and drain extension regions, consisting in forming a gate region on a semiconductor substrate and in implanting dopants into the substrate on either side of and at a certain distance from the gate of the transistor, wherein the producing of the source and drain extension regions consists in forming an intermediate layer on the sidewalls of the gate and on the surface of the semiconductor substrate, this intermediate layer being formed from a material that is less dense than silicon dioxide, and in that the implantation of dopants is carried out through that part of the intermediate layer which is located on the semiconductor substrate.

2. The process according to claim 1, wherein the material forming the intermediate layer may be etched selectively with respect to silicon and in that the intermediate layer is removed after the implantation of dopants.

3. The process according to claim 2, wherein pockets are formed by oblique implantation of dopants of the opposite type to that used for the source, drain and source and drain extension region implantations and in that this oblique implantation is carried out after the intermediate layer has been removed.

4. The process according to claim 2, wherein, after the implantation, a portion of the intermediate layer is left to remain on the sidewalls of the gate and on part of the substrate and in that isolating lateral regions resting on the sidewalls of the gate and on part of the substrate are produced, these isolating lateral regions comprising the residual portion of the intermediate layer surmounted by another material.

5. The process according to claim 1, wherein the implantation energy is chosen so as to obtain a maximum dopant distribution at a depth of at least 3 to 4 nanometres.

6. The process according to claim 1, wherein the length of the gate measured parallel to the length of the channel is less than 180 nanometres, for example less than 100 nanometres.

7. The process according to claim 1, wherein the material forming the intermediate layer is an anti-reflective material used as anti-reflective sublayer during exposure of a photoresist.

8. The process according to claim 1, wherein the material forming the intermediate layer is porous silicon dioxide.

9. The process according to claim 8, wherein the implantation energy is chosen so as to obtain a maximum dopant distribution at a depth of at least 3 to 4 nanometres.

10. The process according to claim 8, wherein the length of the gate measured parallel to the length of the channel is less than 180 nanometres, for example less than 100 nanometres.

11. The process according to claim 1, wherein pockets are formed by oblique implantation of dopants of the opposite type to that used for the source, drain and source and drain extension region implantations and in that this oblique implantation is carried out through the intermediate layer.

12. The process according to claim 11, wherein the material forming the intermediate layer may be etched selectively with respect to silicon and in that the intermediate layer is removed after the implantation of dopants.

13. The process according to claim 12, wherein pockets are formed by oblique implantation of dopants of the opposite type to that used for the source, drain and source and drain extension region implantations and in that this oblique implantation is carried out after the intermediate layer has been removed.

14. The process according to claim 12, wherein, after the implantation, a portion of the intermediate layer is left to remain on the sidewalls of the gate and on part of the substrate and in that isolating lateral regions resting on the sidewalls of the gate and on part of the substrate are produced, these isolating lateral regions comprising the residual portion of the intermediate layer surmounted by another material.

15. The process according to claim 12, wherein the implantation energy is chosen so as to obtain a maximum dopant distribution at a depth of at least 3 to 4 nanometres.

16. The process according to claim 12, wherein the length of the gate measured parallel to the length of the channel is less than 180 nanometres, for example less than 100 nanometres.

* * * * *